United States Patent [19]
Bozada et al.

[11] Patent Number: 5,940,694
[45] Date of Patent: Aug. 17, 1999

[54] FIELD EFFECT TRANSISTOR PROCESS WITH SEMICONDUCTOR MASK, SINGLE LAYER INTEGRATED METAL, AND DUAL ETCH STOPS

[76] Inventors: Christopher A. Bozada, 4905 Bittern Ct., Dayton, Ohio 45424; Tony K. Quach, 3020 Aerial Ave., Kettering, Ohio 45420; Kenichi Nakano, 3606 Barlington Ct., Beavercreek, Ohio 45430; Gregory C. DeSalvo, 4461 Bascule Bridge Dr., Beavercreek, Ohio 45440; G. David Via, 1801 Coventry Rd., Dayton, Ohio 45440; Ross W. Dettmer, 1287 Robbins Run Ct., Dayton, Ohio 45458; Charles K. Havasy, 4437 Wilmington Pike Apt A, Kettering, Ohio 45440; James S. Sewell, 3336 Braddock St., Kettering, Ohio 45420; John L. Ebel, 2191 LaGrange Rd., Beavercreek, Ohio 45431; James K. Gillespie, 3954 Rife Rd., Cedarville, Ohio 45314

[21] Appl. No.: 08/684,755

[22] Filed: Jul. 22, 1996

[51] Int. Cl.$^6$ ................................................. H01L 21/338
[52] U.S. Cl. ......................... 438/172; 438/571; 438/949; 438/951
[58] Field of Search ................................. 438/172, 571, 438/949, 951

[56] References Cited

U.S. PATENT DOCUMENTS

| | | | |
|---|---|---|---|
| 3,764,865 | 10/1973 | Napoli et al. | 317/235 |
| 3,855,690 | 12/1974 | Kim et al. | 29/571 |
| 3,861,024 | 1/1975 | Napoli et al. | 29/579 |
| 3,943,622 | 3/1976 | Kim et al. | 29/579 |
| 4,961,194 | 10/1990 | Kuroda et al. | 357/22 |
| 5,770,489 | 6/1998 | Onda | 438/167 |

OTHER PUBLICATIONS

Etch Rates and Selectivities of Citric Acid/Hydrogen Peroxide on GaAs, Al0.3Ga 0.7As, In 0.2Ga 0.8As, In 0.53Ga 0.47As, In 0.52Al0.48As, and In P, authored by G.C. DeSalvo et al., p. 831 in the J. Electrochem. Soc., vol. 9, No. 3, Mar. 1992.

Citric Acid Etching of Ga AS1–33 Sbx, Al0.5Ga 0.5Sb, and InAs for Heterostructure Device Fabrication, authored by G.C. DeSalvo et al., p. 3526 in the J. Electrochem. Soc., vol. 141, No. 12, Dec. 1994.

High–Performance Self–Aligned P$^+$/N GaAs Epitaxial JFET's Incorporating AlGa As Etch–Stop Layer, authored by J.K. Abrokwah et al., p. 1529 in the IEEE Transactions on Electron Devices, vol. 37, No. 6, Jun. 1990.

Making a High—Yield, 0.33 Micron, MBE—Based GαAs MMIC Production Process, authored by R.D. Remba et al., p. 90 in the proceedings of the 1994 U.S. Conference on GaAs Manufacturing Technology (MANTECH), May 1994.

Simplified Ohmic and Schottky Contact Formation for Field Effect Transistors Using the Single Layer Integrated Metal Field Effect Transistor (SLIMFET) Process, authored by G.C. DeSalvo et al., p. 314 in the IEEE Transactions on Semiconductor Manufacturing, vol. 8, No. 3, Aug., 1995.

(List continued on next page.)

*Primary Examiner*—Richard A. Booth

[57] ABSTRACT

A method for fabricating a periodic table group III–IV field-effect transistor device is described. The disclosed fabrication arrangement uses a single metallization for ohmic and Schottky barrier contacts, employs selective etching with a permanent etch stop layer, employs a non-alloyed ohmic contact semiconductor layer and includes a permanent semiconductor material secondary mask element, a mask element which can be grown epitaxially during wafer fabrication. The invention includes provisions for both an all optical lithographic process and a combined optical and electron beam lithographic process These concepts are combined to provide a field-effect transistor device of reduced fabrication cost, increased dimensional accuracy and state of the art electrical performance.

20 Claims, 4 Drawing Sheets

OTHER PUBLICATIONS

All–Refractory GaAs FET Using Amorphous TiWSIx Source/Drain Metallization and Graded–InxGa 1–xAs Layers, authored by N.A. Papanicolaou et al., p. 7 in the IEEE Electron Device Letters, vol. 15, No. 1, Jan. 1994.

A New Fabrication Technology for AlGaAs/GaAs HEMT LSI's Using InGaAs Nonalloyed Ohmic Contacts, authored by S. Kuroda et al., p. 2196 in the IEEE Transactions on Electron Devices, vol. 36, No. 10, Oct. 1989.

A Highly Manufacturable 0.2 $\mu$m AlGaAs/InGaAs PHEMT Fabricated Using the Single–Layer Integrated–Metal FET (SLIMFET) Process, authored by Charles K. Havasy et al., appearing in the IEEE Gallium Arsenide Integrated Circuit Symposium, Conference Proceedings, San Diego CA, Oct. 1995.

Ohmic Contacts to n–GaAs Using Graded Band Gap Layers of Ga1–xInx As Grown by Molecular Beam Epitaxy, authored by J.M. Woodall et al., p. 626 in the J. Vac. Sci. Technol. vol 19, No. 3, Sep./Oct 1981.

HEMT with Nonalloyed Ohmic Contact Using $n^+$–InGaAs Cap Layer, authored by S. Kuroda et al., p. 389 in the IEEE Electron Device Letters, vol EDL–8, No. 9, Sep. 1987.

Extremely Low Nonalloyed and Alloyed Contact Resistance Using an InAs Cap Layer on InGaAs by Molecular–Beam Epitaxy, authored by C.K. Peng et al., p. 429 in the J. Appl. Phys. vol. 64, No. 1, Jul. 1, 1988.

Non–Alloyed Ohmic Contacts to n–GaAs Using Compositionally Graded InxGa1–xAs Layers, authored by T. Nittono et al., pp. 1718–1722 in the Japanese Journal of Applied Physics, vol. 27, No. 9, Sep. 1988.

Extremely Low Contact Resistances for AlGaAs/GaAs Modulation–Doped Field–Effect Transistor Structures, authored by A. Ketterson et al., p. 2305 in the J. Appl. Phys. vol 57, No. 6, Mar. 1985.

Single–Cycle Lithography Process for Both Large and Sub-Half Micron Features, authored by J.S. Sewell et al., p. 177 in the SPIE, vol. 1671, 1992.

A Combined Electron Beam/Optical Lithography Process Step for the Fabrication of Sub–Half–Micron–Gate–Length MMIC Chips, authored by J.S. Sewell et al., and appearing in the Conference Proceedings of the Fourth National Technology Transfer Conference and Exposition, Dec. 7–9, 1993, Anaheim, California, NASA Conference Publication 3249, vol. 1, p. 54.

FIELD EFFECT TRANSISTOR PROCESS WITH SEMICONDUCTOR MASK, SINGLE LAYER INTEGRATED METAL, AND DUAL ETCH STOPS

CROSS REFERENCE TO RELATED PATENT DOCUMENTS

The present document is somewhat related to the copending and commonly assigned patent application documents "Metal Semiconductor Field-Effect Transistor (MESFET) Device With Single Layer Metal", replaced with Ser. No. 08/684,759, now U.S. Pat. No. 5,796,131; "Single Layer Integrated Metal Process for Metal Semiconductor Field-Effect Transistor (MESFET)", Ser. No. 08/684,760; "High Electron Mobility Transistor (HEMT) and Pseudomorphic High Electron Mobility Transistor (PHEMT) Devices With Single Layer Integrated Metal" Ser. No. 08/684,756, now U.S. Pat. No. 5,698,870; "Single Layer Integrated Metal Process for High Electron Mobility Transistor (HEMT) and Pseudomorphic High Electron Mobility Transistor (PHEMT)" Ser. No. 08/684,760; and "Field-Effect Transistor Device With Single Layer Integrated Metal and Retained Semiconductor Masking" Ser. No. 08/684,734, now U.S. Pat. No. 5,698,900 which are all filed of even date herewith. The contents of these related applications are hereby incorporated by reference herein.

RIGHTS OF THE GOVERNMENT

The invention described herein may be manufactured and used by or for the Government of the United States for all governmental purposes without the payment of any royalty.

BACKGROUND OF THE INVENTION

This invention relates to field-effect transistor fabrication.

The present invention achieves the goal of a field-effect transistor in which a single metallization step realizes the gate contact and the source/drain contacts—a single metallization arrangement which is practical, economically viable and does not require separate masking steps for the Schottky barrier and ohmic junction characteristics of the gate contact and the source/drain contacts respectively. The invention arises from compromise between several semiconductor device disciplines—including material growth, device metallization, and material deposition. The achieved field-effect transistor is technically and economically viable for use in analog transistor applications extending to the microwave and millimeter wave spectral regions for example.

Several concepts appearing in the present invention also appear in the patent and publication literature as stand-alone concepts—concepts used in a different setting or concepts combined in less than the combination contemplated in the present invention. The present invention is, however, believed to represent a novel and unobvious combination of such concepts to achieve a useful result. The concept of using the same metal in parts of the source, drain and gate structure of a field-effect transistor, for example, appears in a certain form in transistors fabricated some years ago when the self aligned gate structure was new in the art. Examples of this same metal concept appear, for example, in the two related RCA patents of Napoli et al., U.S. Pat. No. 3,764,865 and U.S. Pat. No. 3,861,024. The same metal concept also appears in the two related Westinghouse patents of Kim, U.S. Pat. No. 3,855,690 and U.S. Pat. No. 3,943,622.

In each of these four patents however, the disclosed transistor involves use of a common metal to connect to an already formed source/drain ohmic contact and to form the Schottky barrier gate contact. In the silicon material used in the devices of these four patents an ohmic contact is moreover achieved with the mere addition of another layer of material and does not require the alloying, annealing and other complexities needed for a group III-V semiconductor device ohmic contact. The present invention is believed distinguished over the disclosure of these older patents by its use of the same metal to actually form the gate contact as to form the source/drain contacts of the transistor. Moreover in the present invention these source/drain contacts are achieved in a non-alloy fashion.

The U.S. Pat. No. 4,961,194 of S. Kuroda et al., describes gallium arsenide MESFET and HEMT devices which use the combination of non-alloyed ohmic contacts, same metal electrodes, acetone solvent removal of photoresist coatings, ion implanted device separation areas, selective etching and etch stopping at the surface of a device layer. Although each of these concepts may be used in the present invention, additional concepts not disclosed in the Kuroda et al. patent are also a part of the present invention and provide significant distinction over the Kuroda et al. Patent. The Kuroda et al. patent, for example, does not disclose the use of a permanent secondary mask and passivation material layer nor the concept of a gate aperture recess received in a gate window nor the precise and time effective termination of etching operations as is accomplished in applicants' invention. In view of the similar areas of work and in the interest of minimizing the size of the present patent document, the contents of the of S. Kuroda et al. U.S. Pat. No. 4,961,194 patent are hereby incorporated by reference herein.

An article published in the technical literature some years ago is also of interest with respect to the single metal concept and is additionally of interest with respect to the use of non-alloyed ohmic contacts in a field-effect transistor. This article, "A New Fabrication Technology for AlGaAs/GaAs HEMT LSI's Using InGaAs Non-alloyed Ohmic Contacts", is authored by S. Kuroda et al., apparently the same S. Kuroda et al. as appears in the above identified U.S. Pat. No. 4,961,194, and appears at page 2196 in the Institute of Electrical and Electronic Engineers Transactions on Electron Devices, Volume 36, number 10, October, 1989. This Kuroda article is in fact of an especially enlightening contrast in nature with respect to the present invention since it teaches the use of a complex etching sequence during formation of transistor elements and the present invention avoids use of this sequence in favor of a more practical and less costly procedure.

In a somewhat related situation the technical article "All-Refractory GaAs FET Using Amorphous TiWSi$_x$ Source/Drain Metalization and Graded In$_x$Ga$_{1-x}$As Layers" authored by N. Papanicolaou which appears at page 7 in the Institute of Electrical and Electronic Engineers Electron Devices Letters, volume 15, number 1, January, 1994 discloses the use of non-alloyed ohmic contacts in a gallium arsenide field-effect transistor. The Papanicolaou article however, relates to the fabrication of a high temperature field-effect transistor device, a device having refractory metal elements and involving the use of Tungsten metal. The Papanicolaou article also presents an informative discussion of the non-alloyed ohmic contact art.

The inventors of the present invention have also found the textbook "Modern GaAs Processing Methods" authored by Ralph Williams, Artech House, of Boston and London, to be of assistance in explaining and understanding certain aspects attending the present invention including its relationship with the prior art. In the further interest of minimizing the size of the present patent document, the contents of the Ralph Williams, Artech House textbook are therefore hereby incorporated by reference herein.

Non-alloyed ohmic contacts are additionally disclosed in several published technical journal articles as follows:
1. Ohmic Contacts to n-GaAs Using Graded Band Gap Layers of $Ga_{1-x}In_xAs$ Grown by Molecular Beam Epitaxy, authored by J. M. Woodall et al., and appears at page 626 in the J. Vacuum. Science. Technology. Vol 19, number 3, September/October 1981.
2. HEMT with Non-alloyed Ohmic Contacts Using $n^+$-InGaAs Cap Layer, authored by S. Kuroda et al., and appears at page 389 in the IEEE Electron Device Letters, Volume EDL-8, number 9, September 1987.
3. Extremely Low Non-alloyed and Alloyed Contact Resistance Using an InAs Cap Layer on InGaAs by Molecular-Beam Epitaxy, authored by C. K. Peng et al., and appears at page 429 in the J. Applied Physics Volume 64, number 1, Jul. 1, 1988.
4. Non-Alloyed Ohmic Contacts to n-GaAs Using Compositional Graded $In_xGa_{1-x}As$ Layers, authored by T. Nittono et al., and appears at pages 1718–1722 in the Japanese Journal of Applied Physics, Volume 27, number 9, September 1988.
5. Extremely Low Contact Resistances for AlGaAs/GaAs Modulation-Doped Field-Effect Transistor Structures, authored by A. Ketterson et al., and appears at page 2305 in the J. Applied Physics Volume 57, number 6.

Although each of these documents from the prior art may relate to an aspect of the present invention, it is believed that the invention as described herein represents the first combination of the plurality of concepts and compromises necessary to achieve a successful single metal, non-alloyed contact, selective etching-achieved, and secondary mask-inclusive field-effect transistor.

SUMMARY OF THE INVENTION

The present invention provides for the combination of transistor fabrication concepts known in different settings into a field-effect transistor of simplified structure and low cost manufacturing process. The invention adds a structural element, a masking/electrically insulating/passivating layer, and related processing steps which are useful in both the fabrication sequence and as an element of the completed transistor. The invention process relates to several different transistor types.

It is an object of the present invention therefore to provide an all semiconductor wafer based fabrication process for a secondary mask-inclusive single metal field-effect transistor.

It is another object of the invention to simplify the fabrication processing of a field-effect transistor.

It is another object of the invention to provide a field-effect transistor in which a semiconductor material mask layer used during fabrication etching steps is beneficially allowed to remain in the completed device.

It is another object of the present invention to provide a periodic table group III–V field-effect transistor process in which a semiconductor mask layer used during fabrication etching steps is employed as a completed device passivation layer.

It is another object of the invention to provide a gallium arsenide field-effect transistor process in which an etch stop function is provided by either a thin layer of material specifically added for this purpose or by inherent differences in the etch rate of employed semiconductor materials.

It is another object of the invention to provide a field-effect transistor fabrication process in which a pair of semiconductor etch stop layers provide concurrent but different etching terminations for a single etching operation.

It is another object of the invention to provide a field-effect transistor fabrication process in which a secondary mask free of surface quality difficulties associated with some non-semiconductor material permanent masks is avoided.

It is an object of the invention to simplify or eliminate steps from the metal fabrication processing of a field-effect transistor.

It is another object of the present invention to provide a field-effect transistor fabrication process in which certain lithographic and metal deposition steps for forming a Schottky gate contact element also form the transistor drain/source ohmic contact elements.

It is another object of the invention to provide a field-effect transistor fabrication process in which a gallium arsenide device is improved through the use of indium gallium arsenide cap layer-enabled non-alloyed ohmic contacts of low electrical contact resistance.

It is another object of the invention to provide a field-effect transistor fabrication process in which a permanent secondary mask element is used.

It is another object of the invention to provide a field-effect transistor fabrication process in which a dielectric (masking) material permanent secondary mask element is used.

It is another object of the invention to provide a field-effect transistor fabrication process in which a secondary mask element is used to reduce processing steps used in achieving non-alloyed ohmic contacts.

It is another object of the invention to provide a field-effect transistor fabrication process in which a permanent secondary mask of silicon nitride or silicon dioxide is used to enable selective removal of an ohmic contact layer in the device gate region prior to gate metal deposition.

It is another object of the invention to provide a field-effect transistor fabrication process in which a permanent secondary mask of silicon nitride or silicon dioxide is used to protect source and drain regions ohmic connection layer material during gate region etching.

It is another object of the invention to provide a field-effect transistor fabrication process which is relatively insensitive to process-induced variations and therefore provides material growth characterization capability.

It is another object of the invention to provide a field-effect transistor fabrication process which provides consistent low resistance electrical contacts within a wafer and between wafers.

It is another object of the invention to provide a field-effect transistor fabrication process in which electrical contact alloying problems and resulting contact variability are overcome.

It is another object of the invention to provide a field-effect transistor fabrication process which employs the controllability of a selective etching process in the gate region formation.

It is another object of the invention to provide a field-effect transistor fabrication process which eliminates a critical alignment step usually encountered during gate defining and locating through the formation of ohmic contacts and gate region metallizations during a common step.

It is another object of the invention to provide a field-effect transistor fabrication process in which common metallization for source drain and gate elements is combined with non-alloyed ohmic contacts and a plural mask (one permanent) fabrication arrangement.

Additional objects and features of the invention will be understood from the following description and claims and the accompanying drawings.

These and other objects of the invention are achieved by the method of forming gate, source and drain electrical contacts in a group III–V semiconductor material secondary mask-inclusive field-effect transistor comprising the steps of:

providing a transistor-divided group III–V semiconductor material field-effect transistor wafer in which a first thin semiconductor etch stop layer overlays a selected one of a channel layer and a channel layer-covering barrier layer and in which a superimposed group III–V semiconductor material-inclusive ohmic connection layer is overlaid by a second semiconductor etch stop layer and then a group III–V semiconductor material secondary mask layer;

forming a gate window recess extending through said secondary mask layer and said second semiconductor etch stop layer down to said ohmic connection layer using a temporary first photoresist mask etching sequence;

covering said secondary mask layer and said now-exposed gate window recess ohmic connection layer with a second and then a third temporary photoresist mask layers, forming source, drain and gate region openings through said second and third temporary photoresist mask layers using a photolithographic sequence, said formed openings extending down to said group III–V semiconductor material secondary mask layer in said source and drain openings and through said secondary mask and passivation material and second metallic semiconductor etch stop layers down to said ohmic connection layer in said gate window opening;

etching away both said ohmic connection layer in said gate window opening and said permanent secondary mask and passivation material layer in said source and drain openings;

halting said etching in said gate window opening and in said source and drain openings at said first thin semiconductor etch stop layer and at said second thin semiconductor etch stop layer respectively;

removing said first thin semiconductor etch stop layer from said gate window opening and said second thin semiconductor etch stop layer from said source and drain openings, said removing step exposing said selected one of a channel layer and a channel layer-covering barrier layer in said gate window opening and said ohmic connection layer in said source and drain openings;

forming a Schottky barrier electrical contact with said selected one of a channel layer and a channel layer-covering barrier layer semiconductor materials in said gate window location and a non-alloyed ohmic electrical contact with said ohmic connection semiconductor material layer in said source and drain locations by depositing a single layer of contact metal over exposed surfaces of said wafer;

removing portions of said second and third temporary photoresist mask layers and said single layer of contact metal external of said gate window Schottky barrier electrical contact and said source and drain non-alloyed ohmic electrical contact.

DETAILED DESCRIPTION

FIG. 1 in the drawings (i.e., the views of FIG. 1a through FIG. 1l) shows a different arrangement of the SLIMFET invention described in the above-identified copending patent documents, an arrangement in which the silicon nitride secondary mask layer is replaced by a semiconductor material mask layer. Moreover this semiconductor material layer is a layer which can be grown epitaxially at low cost during the same sequence used to form the other semiconductor layers in the device. Use of a semiconductor material layer in lieu of the silicon nitride material layer offers advantages in the nature of a more uniform epitaxially formed secondary mask layer, faster starting wafer fabrication times and thereby lower wafer cost, freedom from the pinholes commonly encountered in silicon nitride and similar materials and provides more uniform electrical and physical characteristics in the completed field-effect transistor. The present semiconductor material secondary mask arrangement of the invention is however, somewhat more difficult to process in the sense that the etchings used on the other layers of the transistor also react with the semiconductor mask layer material to various degrees and thereby impose a requirement for close etch control in these steps.

The processing steps of the FIG. 1 views presume the semiconductor layers which underlay the secondary mask layer have been previously formed as is discussed briefly in the "Single Layer Integrated Metal Process for High Electron Mobility Transistor (HEMT) and Pseudomorphic High Electron Mobility Transistor (PHEMT)" AFD 00082, Ser. No. 08/684,761 copending patent document. It is significant however, that the transistor related semiconductor layers in the present embodiment of the invention differ significantly from those used in the Ser. No. 08/684,761 copending patent document.

Figure 1A:
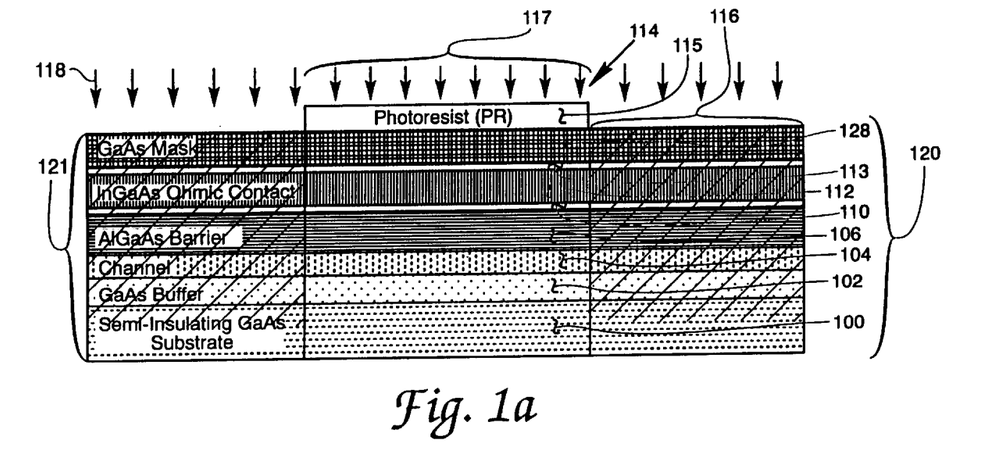
FIG. 1a shows an initial wafer structure usable to achieve a field-effect transistor.
Figure 1B:
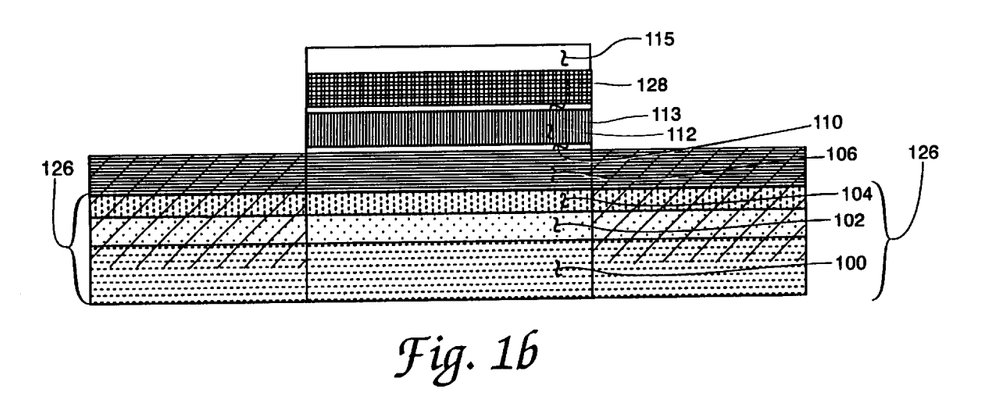
FIG. 1b shows the FIG. 1a structure after an additional processing step.

Fabrication of a field-effect transistor device according to the present invention may start with a wafer having each of the semiconductor layers represented in FIG. 1a previously formed or alternately may start with some intermediate status of a wafer such as a wafer having the substrate 100, the buffer layer 102 and the channel layer 104 previously formed for example. Wafers having all of the layers represented in FIG. 1*a* may be obtained to specification, e.g., the Table 1a specification below, or as standard products from several suppliers to the integrated circuit art. Wafers having some intermediate number of predisposed layers will also be available from such sources. Selection from these starting point options is therefore primarily a matter of available fabrication resources and economic considerations. The FIG. 1*a* layer structure of course indicates the transistor to be fabricated in the indicated sequence is either a high electron mobility transistor or a pseudomorphic high electron mobility transistor version of the field-effect transistor; alternate starting wafer arrangements accoiated with other transistor types are shown in the drawings of the above-identified copending and incorporated by reference additional patent documents.

In the FIG. 1*a* view of a wafer segment a field-effect transistor channel layer 104 is shown to be received on a buffer layer 102 which is supported by a substrate 100. This channel layer is in turn covered by a barrier layer 106, a thin but permanent etch stop layer 110 and an ohmic contact layer 112. The ohmic contact layer 112 is in turn covered by a second thin but permanent etch stop layer 113 and then by the semiconductor secondary mask layer 128. These semiconductor layers of the FIG. 1*a* wafer 114 may be comprised of the materials indicated in the FIG. 1*a* drawing and may have the thickness, doping levels and other characteristics indicated in Table 1a below.

As may be already apparent to persons skilled in the gallium arsenide field-effect transistor art and also apparent from a brief consideration of the several layers represented in the lines of Table 1a, certain additional routine or standard layers in addition to those shown in FIG. 1*a* are often used in the fabrication of a HEMT or pHEMT device. These additional layers may include for example a graded layer located intermediate the barrier layer 106 and the etch stop layer 110. Such a graded layer is helpful in enabling charge carriers to transition from the lightly doped semiconductor material of the barrier layer 106 to the very heavily doped semiconductor material of the ohmic contact layer 112 for example.

The spacer layers indicated between the channel layer 104 and barrier layer 106 are another example of these standard layers. These spacer layers are used to physically separate the channel layer from the supply layer to reduce scattering. Since the physical and fabrication nature of the graded and spacer layers, and additional other routine or standard layers which may be used in a HEMT or pHEMT device, is dependent on process related considerations i.e., on the equipment and step variations which are used by each wafer supplier, such routine or standard layers are omitted in the FIG. 1 drawing.

Notwithstanding this FIG. 1 expediency, Table 1a above indicates the identity and characteristic of each actually-processed semiconductor layer including layer gradations which have been found convenient in a starting-point wafer using the processing equipment and expertise available to the present inventors. In Table 1a the layers indicated at line TABLE 1a

| Line No. | Purpose | Material Mole Fraction | Doping Concentration [cm$^{-3}$] | Superlattice Repetition | Layer Thickness | Total Thickness | FIG. 3a Reference |
|---|---|---|---|---|---|---|---|
| 1. | In lieu of Si$_3$N$_4$ 2nd M | GaAs | undoped × 10 cm$^{-3}$ | 1X | 200 Å | 200 Å | 128 |
| 2. | Etch Stop | AlAs | n-type Si 1 × 10$^{19}$ cm$^{-3}$ | 1X | 50 Å | 250 Å | 113 |
| 3. | Ohmic Contact | InAs | n-type Si 5 × 10$^{19}$ cm$^{-3}$ | 1X | 140 Å | 390 Å | 112 |
| 4. | Ohmic Contact | GaAs | n-type Si 6 × 10$^{18}$ cm$^{-3}$ | Begin 10X | 11.3 Å | 503 Å | 112 |
| 5. | Ohmic Contact | InAs | n-type Si 5 × 10$^{19}$ cm$^{-3}$ | End | 15.2 Å | 655 Å | 112 |
| 6. | Ohmic Contact | GaAs | n-type Si 6 × 10$^{18}$ cm$^{-3}$ | 1X | 50 Å | 705 Å | 112 |
| 7. | Etch Stop | AlAs | n-type Si 1 × 10$^{19}$ cm$^{-3}$ | 1X | 30 Å | 805 Å | 110 |
| 8. | Barrier Layer | AlGaAs x = 0.20 | undoped × 10 cm$^{-3}$ | 1X | 250 Å | 1055 Å | 106 |
| 9. | Delta Doped | | n-type Si 5 × 10$^{12}$ cm$^{-3}$ | X | 0 Å | 1055 Å | 106 |
| 10. | Spacer Layer | AlGaAs | undoped × 10 cm$^{-3}$ | 1X | 40 Å | 1095 Å | 106 |
| 11. | FET Channel | InGaAs x = 0.15 | undoped × 10 cm$^{-3}$ | 1X | 130 Å | 1225 Å | 104 |
| 12. | Buffer | GaAs | undoped × 10 cm$^{-3}$ | 1X | 4000 Å | 5225 Å | 102 |
| 13. | Buffer | GaAs | undoped × 10 cm$^{-3}$ | Begin 12X | 30 Å | 5585 Å | 102 |
| 14. | Buffer | AlGaAs x = 0.20 | undoped × 10 cm$^{-3}$ | End 12X | 150 Å | 7285 Å | 102 |
| 15. | Buffer | GaAs | undoped × 10 cm$^{-3}$ | 1X | 500 Å | 67885 Å | 102 |
| 16. | Substrate | GaAs | semi-insulating × 10 cm$^{-3}$ | X | Å | 7885 Å | 102 | numbers 1 and 2 relate especially to the semiconductor secondary mask layer of the present invention and represent a point of significant difference between the present invention and the invention of the "Single Layer Integrated Metal Process for High Electron Mobility Transistor (HEMT) and Pseudomorphic High Electron Mobility Transistor (PHEMT)" related and copending patent document.

In Table 1a the layers indicated at line numbers 3, 4, 5 and 6 comprise the grading which may be used in forming the ohmic contact layer 112 even though several of these layers are not expressly shown in the FIG. 1 drawings for example. These differences and the differences relating to the ohmic contact layer suggest the FIG. 1 drawing and the descriptions relating thereto in this document may therefore be viewed as showing the essential steps and the essential layers in a present invention fabrication sequence however, the actual processing used to obtain these layers in applicants' embodiment of the invention may be additionally understood by a simultaneous consideration of FIG. 1 and Table 1a.

In a related manner the recitation of routine or standard layers in the claims of this document is considered to be an undue limitation of the scope of these claims, especially in instances wherein an alternate arrangement transistor—a transistor including alternate routine or standard layer structure, could be asserted to avoid claims reciting different or no standard layers. Several of the claims appended to the present disclosure therefore also omit routine or standard layer language and are couched in terms of what is deemed to be essential steps and essential layers language.

Before departing from the subject of Table 1a it appears worthy of note that the information in this table represents a specification for fabrication of the FIG. 1a starting point structure using certain processing equipment and expertise. The layers recited in this Table 1a data, including the herein new secondary mask layer and second etch stop layers of lines 1 and 2 in Table 1a, may all be formed by molecular beam epitaxy (MBE) or metal organic chemical vapor deposition, MOCVD, for example and are of a single crystal nature. Table 1a by reason of this single crystal or epitaxial relationship does not include certain later occurring additional structure such as photoresist masking layers, metallization layers or ion implant achieved regions in its contents; these additions are of course not of a single crystal nature. Such additional structure is described below in connection with the FIG. 1 sequence of steps. Notably Table 1a does include the secondary mask layer of line 1 since this layer is herein a semiconductor layer and may also have a single crystal relationship with the underlying transistor semiconductor layers.

Although the purpose of the layer achieved from each step in Table 1a, i.e., the contribution to transistor function which results from each step of this table, will be apparent from the already presented disclosure and to those skilled in the transistor fabrication art, the following brief description of these layer to function relationships may also be helpful. The cover layer of line 1 in Table 1a is used to fabricate the secondary mask element. The etch stop layer of line 2 in Table 1a is used to protect the underlying gallium arsenide of the ohmic layer from removal or attack during removal of the ohmic contact layer 112. The first etch stop layer of line 7 in Table 1a is also used to protect the underlying gallium arsenide of the ohmic layer from removal or attack during removal of the ohmic contact layer 112. The barrier layer of line 8 acts to confine charge carriers to the channel layer 104 of the FIG. 1 transistor. The delta doped layer of line 9 in Table 1a serves to provide carriers in the completed FIG. 1 transistor.

The spacer layer of line 10 in Table 1a serves to reduce carrier scattering. The channel layer of line 11 in Table 1a is the location of charge carrier flow between source and drain of the FIG. 1 transistor. The buffer layer 102 of FIG. 1 and lines 12–15 in Table 1a serves as a crystallographic interface between the lattice structure of the substrate member 100 and the differing lattice structure of the channel layer 104. To accomplish this interface however, it is desirable to use a multiple layer superlattice fabrication sequence as shown in lines 12–15 of Table 1a. In this structure the four layers accomplish a smooth, dislocation-free starting point for subsequent high quality crystal growth.

The single crystal or epitaxial layers on the wafer 114 can actually be accomplished using either molecular beam epitaxy (MBE), metal organic chemical vapor deposition (MOCVD) or possibly other growth techniques. The invention uses highly doped InGaAs layers or other low energy bandgap material compatible with the underlying FET layers as the cap layer or ohmic contact layer 112 to form non-alloyed ohmic contacts using known Schottky refractory metallization procedures. The wafer 114 also includes two etch stop layers, represented at 110 and 113 in FIG. 1, in order to precisely control later-described etch operations.

The FIG. 1 drawing shows the incorporation of etch stop layer 110 and etch stop layer 113 into the wafer 114 structure, in order to provide non-photoresponsive, permanence and temperature immunity characteristics into the mask structures. These layers are fabricated from semiconductor materials which can be selectively removed from specific areas of the structure without harm to adjacent portions of the transistor during later portion of the fabrication sequence. The secondary mask layer 128 for example serves as a combination of a masking material for a mask used in a subsequent fabrication step, as a selectively removable masking material which is nonresponsive to photoresist mask removal materials, as a heat tolerant electrical insulator on which metallic conducting material can be deposited and as a permanent covering layer which is not detrimental to performance in the completed transistor. Since a major part of this secondary mask layer 128 remains in the finished transistor, it also provides some degree of passivation and protection of the completed transistor's exposed surface (i.e., the non-metal covered surface portions) from contamination and physical damage. For present discussion purposes the masking one of these layer 128 functions is of primary interest. Indeed without the masking capabilities arising from this secondary mask layer 128, and especially the later described benefits of such a mask in precluding another critical mask realignment operation, the benefits of the present invention could not be achieved.

The layer 128 herein may be referred to as a secondary mask or consumable secondary mask layer, such references being in relation to its function in the fabrication sequence of protecting the field-effect transistor ohmic layer during gate window recess etching. Notably in the presently described embodiment of the invention the secondary mask layer 128 is rightfully included in the Table 1a described layers of the transistor; this is of course in keeping with the fact that this layer in the present arrangement of the invention lend to both MBE or MOCVD fabrication and to single crystal relationships with the underlying FIG. 1 layers. The consumable aspect of the present secondary mask layer 128 relates of course to its etch-consumed nature in gate source and drain portions of the device structure for example. Portions of the mask layer 128 underlying other parts of the FIG. 1 device remain permanently with the fabricated device notwithstanding this consumable nature and it is therefore referred to simply as the secondary mask layer in the present document.

Continuing with a discussion of the other drawings in the FIG. 1 series, an ion implantation isolation of adjacent transistors on a wafer, an implantation as represented at 118 in FIG. 1a, may be used to achieve adjacent transistor electrical isolation in the layers below secondary mask layer 128. Such implanting, with oxygen ions for example, is preferably accomplished through use of the single dual use mask indicated at 115 in FIGS. 1a and 1b—in order to avoid a tedious and error prone mask realignment step if two masks and a two step sequence were used. FIG. 1a in the drawings therefore shows the addition of the lithographically configured photoresist mask 115 over the secondary mask layer 128 of FIG. 1a. This dual use mask 115 may be made of the photoresist material PGMI/1813 made by MCC and Shipley of Newton Mass. and Marlborough, Mass. The multiple-layered isolation regions achieved by such ion implantation are shown at 120 and 121 in FIG. 1a.

By way of additional explanation, since the InGaAs of the ohmic contact layer 112 and to some extent the secondary mask layer 128 once formed in its heavily doped and electrically conducting condition is not easily made electrically non-conducting, an actual removal of this material in the isolation regions between adjacent transistors of a wafer is desirable. Several techniques for etching this ohmic contact layer 112 material away are available. Standard photolithography processes which define the desired transistor active region 117 by way of the mask 115 and enable a selective mesa isolation wet etch in the non-active heavily doped regions 116 can for example be used.

Figure 1C:
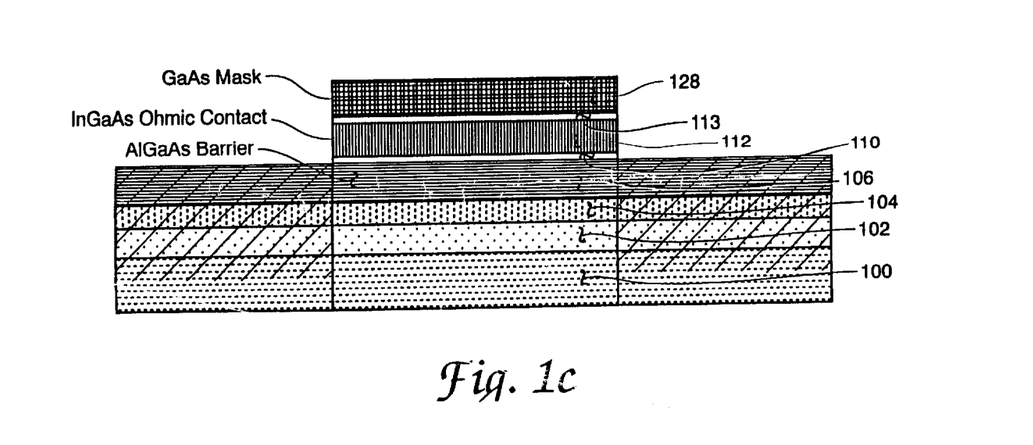
FIG. 1c shows the FIG. 1b structure after an additional processing step.

Accomplished removal of the ohmic contact layer 112, etch stop layers 110 and 113, and secondary mask layer 128 material is indicated in FIG. 1c. The appearance of the ion implanted regions 120 and 121 after removal of implant region portions of the ohmic contact layer 112 is shown at 124 and 126 in FIG. 1b. The photoresist mask 115 has also been removed in the FIG. 1c drawing.

Figure 1D:
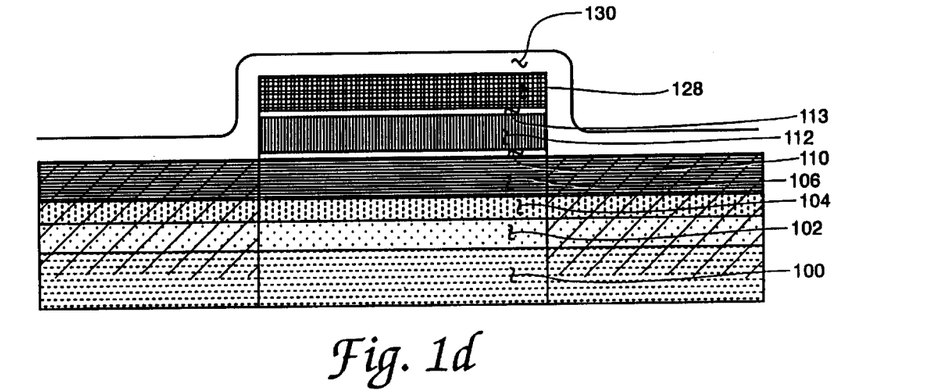
FIG. 1d shows the FIG. 1c structure after an additional processing step.
Figure 1E:
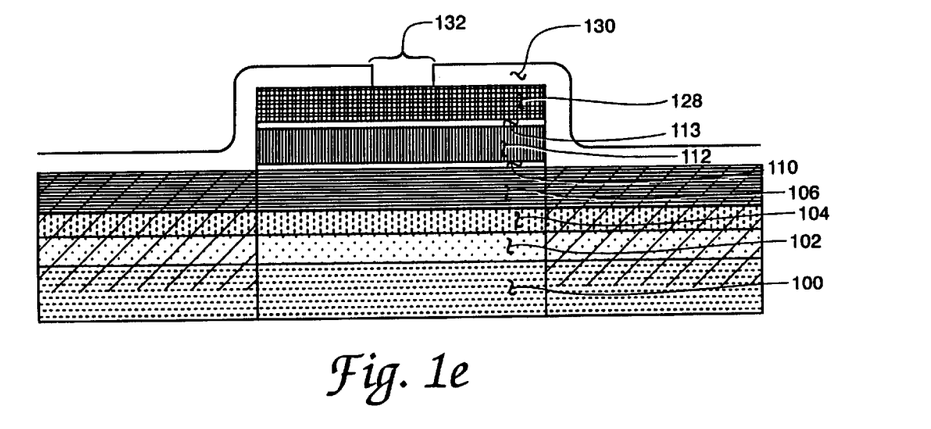
FIG. 1e shows the FIG. 1d structure after an additional processing step.
Figure 1F:
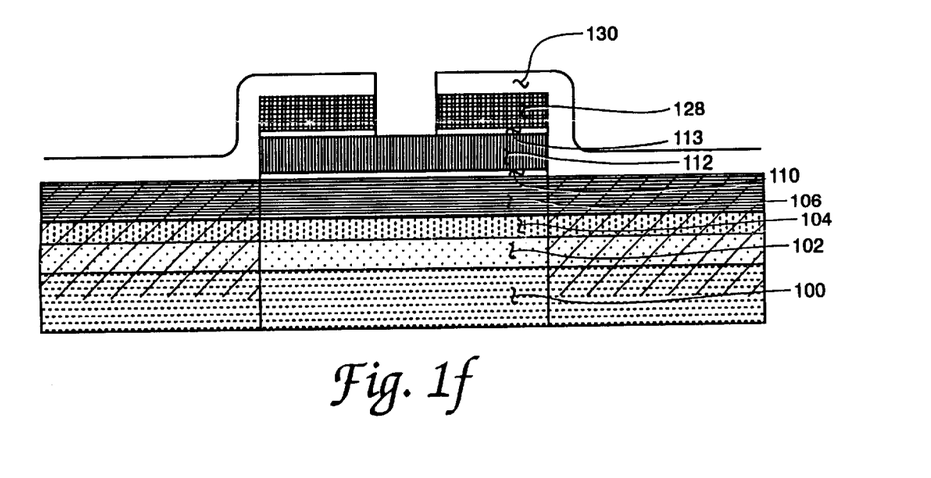
FIG. 1f shows the FIG. 1e structure after an additional processing step.

FIG. 1d of the drawings shows a photoresist mask layer 130 to be added to the FIG. 1c structure. This photoresist mask layer 130 may be made of the Shipley photoresist material 1813. A gate recess aperture or gate window opening 132 has been formed photolithographically in this photoresist mask layer 130 in FIG. 1e. The recess aperture 132 of course provides access to the secondary mask layer 128 in order that it can be removed from the gate window area during a subsequent etching. Such removal of the secondary mask layer 128 material in the recess aperture 132 to leave the desired gate window recess in the secondary mask layer 128 and accomplish exposure of the ohmic contact layer 112 material is represented in FIG. 1f. A citric acid based etch solution is used to remove the secondary mask layer 128 in the recess aperture 132.

Figure 1G:
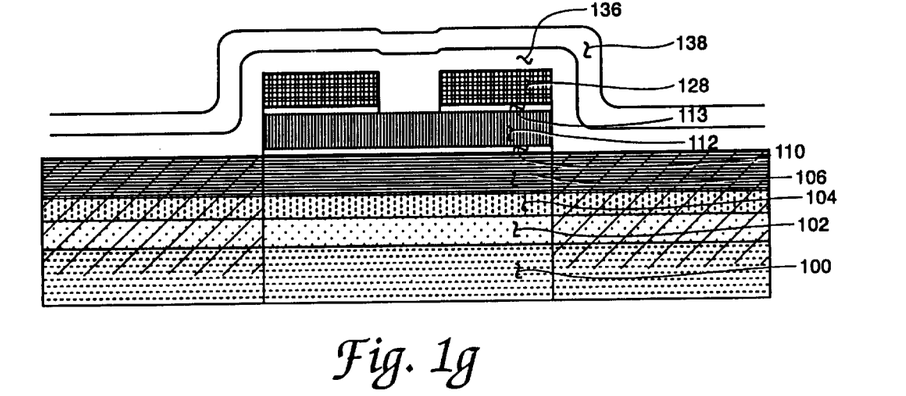
FIG. 1g shows the FIG. 1f structure after an additional processing step.

Next in what may be described as a large feature or optical lithography gate region arrangement of the invention the photoresist layer 130 is removed and two new and differing layers 136 and 138 of photoresist are applied as shown in the FIG. 1g drawing. The two photoresist materials used in the FIG. 1g step provide sensitivity and mutual exclusivity to two differing spectral ranges of exposure energy in the ultraviolet range as described below herein. A photoresist material such as the PMGI type which includes a polymethylmethacrylate component is suitable for the lowermost layer 136 of this photoresist. Suitable PMGI photoresist is available from Microlithography Chemical Corporation of Newton, Mass. A photoresist material such as the type 1813 resist manufactured by the Shipley Company Incorporated is suitable for the upper resist layer 138 in FIG. 1g. The PGMI photoresist of layer 136 is of course applied first to the FIG. 1h structure. A large feature arrangement of the invention using these photoresist materials is generally considered to mean a transistor having a gate region in which the smallest defined feature or the smallest desired dimension is of at least six tenths of a micron in size. An electron beam exposure-based accomplishment of the invention for gate region dimensions smaller than this six tenths of a micron is described in the AFD 00082: Single Layer Integrated Metal Process for High Electron Mobility Transistor (HEMT) and Pseudomorphic High Electron Mobility Transistor (PHEMT) copending patent document which is incorporated by reference herein and is considered to represent an alternate arrangement of the present invention.

Figure 1H:
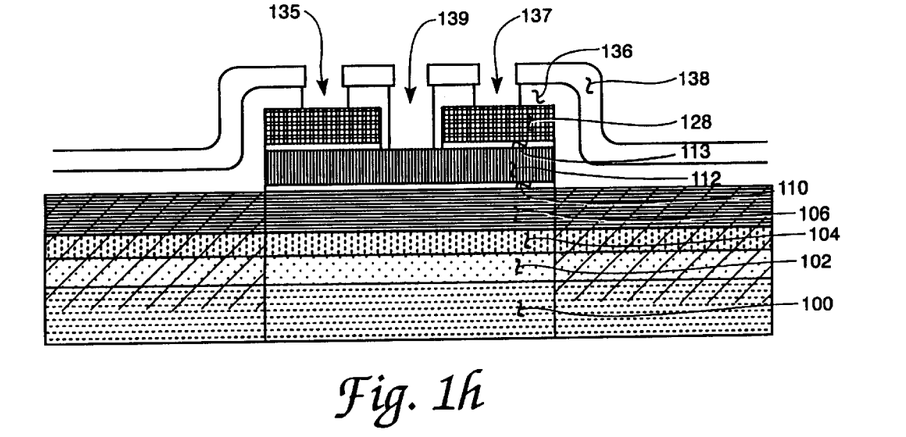
FIG. 1h shows the FIG. 1g structure after an additional processing step.

The formation of photolithographically defined source contact, and drain contact, apertures 135 and 137 (respectively for example) in the photoresist layers 136 and 138 is indicated in FIG. 1h of the drawings. Formation of the gate aperture 139 also is represented in this drawing. In addition to these source contact, and drain contact apertures, the FIG. 1h step may also define gate feed, and contact pad areas of the transistor. The ensuing FIGS. 1i and 1j steps represent the definition of gate geometry, i.e., the gate length and gate width dimensions of the transistor in the aperture 139. (Gate "length" here is presumed, according to convention, to extend in the direction of charge carrier flow).

Notably the gate geometry definition in the FIG. 1h step is accomplished on the ohmic contact layer 112 while the source and drain definitions occur on the secondary mask layer 128. It is also notable that the developing and removal of mask aperture areas represented in FIG. 1h have been used to accomplish the upper mask overhang, lip or cliff region indicated at 141 in FIG. 1j. This overhang region assures the presence of deposited metal discontinuities which are useful during a later metal removal step (i.e., a metal lift-off step) of the fabrication process. These metal discontinuities enable segregating or separating desired gate source and drain contact metal from undesired excess metal inherently deposited on the upper surface of the transistor. A double exposure sequence involving two differing ultraviolet light spectral ranges as described in connection with the EBOL processing sequence in the copending AFD 00082: Single Layer Integrated Metal Process for High Electron Mobility Transistor (HEMT) and Pseudomorphic High Electron Mobility Transistor (PHEMT) patent document is used in defining the apertures 135, 137 and 139 in FIG. 1h. As is known in the lithography art an over development of the image in the photoresist layer 136 may be used to achieve the lip or overhang or cliff region 141.

Figure 1I:
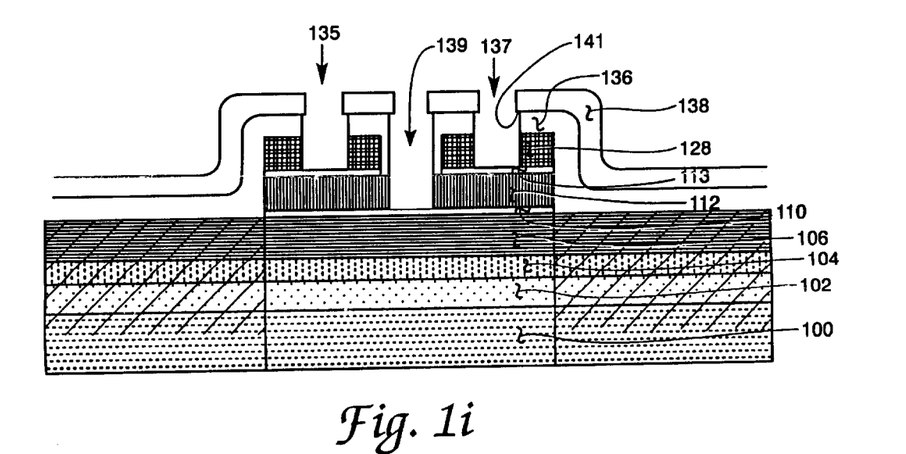
FIG. 1j shows the FIG. 1i structure after an additional processing step.
FIG. 1k shows the FIG. 1j structure after an additional processing step.
FIG. 1l shows the FIG. 1k structure after an additional processing step.

In the FIG. 1i drawing use of a selective etch step to remove a gate contact-sized aperture in the ohmic contact layer 112 is represented. Complete removal of the ohmic contact layer 112 down to the etch stop layer 110 is desired since the subsequently received gate metal should be formed on the barrier layer underlying the ohmic contact layer 112. This selective etch for the indicated indium gallium arsenide material of this layer may be accomplished using the citric acid/hydrogen peroxide etch process described in the AFD 00082: Single Layer Integrated Metal Process for High Electron Mobility Transistor (HEMT) and Pseudomorphic High Electron Mobility Transistor (PHEMT) patent document and in the four published papers of G. C. DeSalvo, G. C. DeSalvo, R. D. Remba and J. K. Abrokwah described therein. A timed selective etch is preferred for the aperture 139 ohmic material removal step indicated in FIG. 1i; both wet and dry etching is possible.

It is notable that during this gate window sized aperture etch in the aperture 139 of the ohmic contact layer 112, a removal of the secondary mask layer 128 in the aperture 135 and 137 is also occurring simultaneously, a removal accomplished by the same citric acid and hydrogen peroxide etchant. This simultaneous etching in two different locations of the FIG. 1h structure requires a selection of a somewhat precise ratio of hydrogen peroxide and citric etchant volumes in order to reach concurrent termination points in the two different etching locations notwithstanding the different material thickness which may be present. It is notable that a significant degree of criticality is removed from this simultaneous etching in two different locations by the presence of the etch stop layer 110 and etch stop layer 113 which serve to terminate the etching in the vertical direction of FIG. 1i. This vertical termination however, does not stop etching in the horizontal directions of the FIG. 1i materials in ohmic contact layer 112 and secondary mask layer 128. Hence the determination of proper hydrogen peroxide to citric acid etchant volume ratios is important in order to reach concurrent termination points.

By way of additional explanation the etch stop layer 113 is found desirable in the present arrangement of the invention because of the characteristics of available semiconductor material etchants. More precisely, the buffered-oxide etchant described in the silicon nitride secondary mask versions of the present invention copending patent documents is capable of removing the material of a silicon nitride secondary mask layer and of stopping its etching action when the underlying InGaAs of an ohmic contact layer is reached. Because of this discrimination ability, an etch stop layer 113 may be avoided in the silicon nitride secondary mask arrangements of the invention. In the case of a semiconductor material secondary mask member as contemplated herein however, this clear segregation of etchant responses is not available and the etchant used to remove the secondary mask layer 128 will react significantly with the InGaAs of the next adjacent semiconductor layer, the ohmic contact layer 112. In order to prevent or limit this undesired reaction the additional etch stop layer 113 is desirable in the present arrangement of the invention.

The simultaneous etching in the aperture 135/137 and aperture 139 in FIG. 1i enables a better understanding of the importance of the secondary mask layer 128 in achieving a transistor according to the present invention. Without the separate but jointly present in FIG. 1i masks of layers 128 and 136 for the aperture 135/137 and aperture 139, a delicate mask realignment step and separate distinct metallization operations for these regions would be required—as is the present state of the field-effect transistor fabrication art. (It is particularly notable, for example, that the process of the above identified U.S. Pat. No. 4,961,194 of S. Kuroda et al., does not include the secondary mask layer 128 and does contemplate separate metallization steps.) In addition to enabling a single common metallization step, the absence of a realignment step is particularly desirable in the gate region of a field-effect transistor since accurate gate placement is needed to obtain optimum performance from a fabricated device.

Figure 1J:
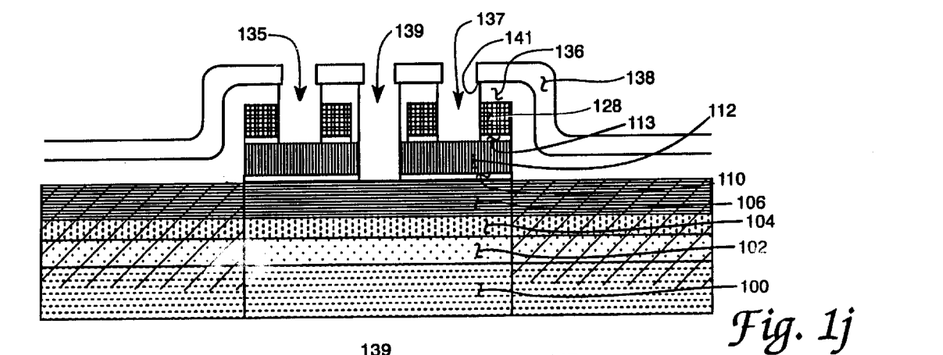

FIG. 1j represents accomplishment of a wet chemical etching of the etch stop layer 110 and etch stop layer 113 to expose the ohmic contact layer 112 material in the source and drain regions in the transistor and the barrier layer 106 in the gate region of the transistor. A buffered oxide etchant solution is used for the FIG. 1j joint source/drain and gate etches. This FIG. 1j etch step represents a selective removal of the aluminum arsenide of the two stop etch layers 110 and 113 through the expediency of having included the secondary mask layer 128 in the FIG. 1 device and without use of a two step lithographic process.

Figure 1K:
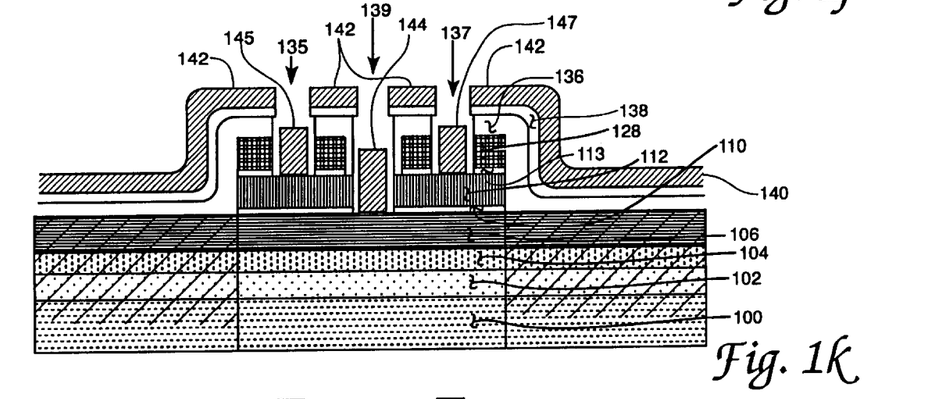

With the source/drain and gate regions of the FIG. 1j device exposed, a single deposition of metal as represented at 140 in FIG. 1k can be accomplished. A metal scheme of titanium, platinum, and gold in the respective thicknesses of 200: 500: 5300 has been found desirable for this purpose. Other metal combinations including titanium and gold with a total thickness of 6000 Angstroms may also be used in this step. Any metal that forms both a Schottky contact to the gallium arsenide, or other selected group III–V gate region semiconductor material, and an ohmic contact to highly doped ohmic contact layer versions of this semiconductor material and can be deposited by evaporation can be used in the present metallization step—as long as the metal also does not degrade the underlying photoresist during deposition. This metallization step forms the gate contact 144 in FIG. 1k and also deposits metal at 142 over the top surface of the FIG. 1k structure, i.e., over the photoresist layer 138.

This metallization step may be used to form the interconnecting conductors of the transistor including the gate feed and pad regions. For such interconnecting conductor formation it is necessary to have previously removed the photoresist layers 136 and 138 at the desired interconnect regions since a metal lift-off step is used subsequently to remove any metal supported only by such photoresist mask material. Since the same photoresist pattern is used both as the gate recess etch mask and as the present gate metal definition mask, the gate metal of the FIG. 1k step will be self-aligned to the etched gate recess region on the FET channel.

By way of the differing semiconductor materials and doping concentrations present in the source/drain and gate regions of the device, i.e., present below the FIG. 1k metallizations, the desired ohmic contact electrical characteristics are obtained at the source/drain contact regions and a Schottky barrier electrical characteristic is obtained at the gate contact region with this single metallization step. Since the FIG. 1k photoresist pattern is used both as the gate recess etch mask in FIG. 1i and FIG. 1j and as the gate metal definition mask in the FIG. 1k step, the gate metal is self-aligned to the etched gate recess region on the transistor channel—as is also desired for achieving the optimum alignment which enables best transistor yield and performance.

Figure 1L:
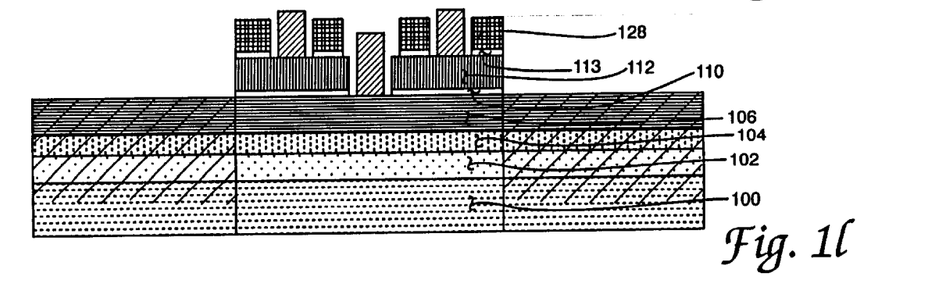
Figure 2:
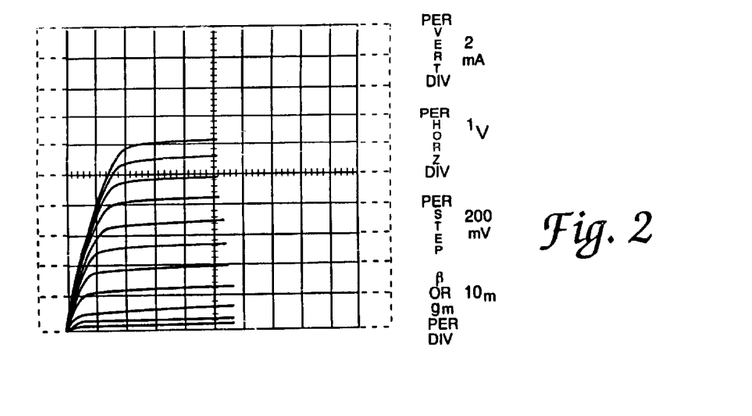
FIG. 2 shows a set of electrical characteristics for a transistor device according to the invention.

Removal of the photoresist layers 136 and 138 is represented in the FIG. 1l drawing. This removal accomplishes a metal lift-off separation of undesired metal from desired metal by way of the lip or overhang or cliff region 141 areas described previously. The device achieved after this metal lift-off includes non-alloyed contacts in the source/drain and gate regions. Following such metal lift-off the FIG. 1 device is complete and ready for known device incorporation procedures. It is notable that the secondary mask layer 128 and the etch stop layer 113 as well as the etch stop layer 110 remain in the completed device of FIG. 1k. The secondary mask layer 128 is especially useful in this remaining behind role since it is not functionally active in operating the completed transistor and thereby can provide with impunity a degree of passivation and protection for the underlying layers which are functionally active.

Table 1b below provides a comparison between the steps used in a conventional field-effect transistor fabrication process and the process of the present invention. Although a first blush review of this comparison table may suggest the present invention steps are almost as numerous as those of the previous process a detailed consideration of the data in this table reveals that several of the present invention steps can also be accomplished more quickly—by a considerable margin, than is possible in the more conventional process.

TABLE 1b

| SLIMFET Process | Standard FET Process |
| --- | --- |
| 4 Lithogaphy Steps: | 5 Lithography Steps: |
| Mask Alignment | Mask Alignment |
| Device Isolation | Device Isolation |
| Gate Window | Ohmic Metal |
| Ohmic/Gate Feed/ | Gate Feed & Contact Pad Metal |
| Pad/Gate Metal | Gate Metal |
| 2 Metal Depositions and | 4 Metal Depositions and |
| Metal Lift-Off Steps | Metal Lift-Off Steps |
| Mask Alignment Marks (Ti/Au) | Mask Alignment Marks (Ti/Au) |
| Ohmic/Contact Pads/Gate (Ti/Au) | Ohmic Contacts (AuGe/Ni) |
|  | Gate Feed & Contact Pads (Ti/Au) |
|  | Gate Contacts (Ti/Au) |
| 0 Metal Alloys | 1 Metal Alloy |
| 3 Selective Etch Steps | 1 Selective Etch Step |
| Gate Window | Gate Recess |
| Gate Recess |  |
| GaAs Removal for Ohmic Contacts |  |

In particular the elimination of steps involving metallization and its attending lithography from the SLIMFET process represent notable time and cost savings. The hours of time involved in accomplishing an accurate mask alignment, the time to evacuate a metallization chamber, the time to accomplish the metallization, and then the time to relieve the vacuum at a controlled rate typically combine to limit fabrication throughput when multiple metallizations are involved for a device. Many etching steps in comparison are of significantly lower cost than a metallization step and therefore are of less significance in device fabrication time and bottom line cost. In considering the table 1b comparison of the present SLIMFET process with a conventional process therefore these second blush detailed factors also merit consideration.

By way of additional comparisons relating to the present invention, it is recognized that conventional transistors of the type described herein make use of the well known gold germanium nickel ohmic contacts and thereby achieve what is considered to be desirable low electrical resistance at these contacts. It is further recognized that the presently espoused use of Schottky metallization, i.e., the herein disclosed titanium platinum gold or platinum gold alloys for example for this ohmic contact function, may be considered an area of device performance compromise, to which somewhat higher source and drain contact resistance can result. With the herein disclosed arrangement of the ohmic contact semiconductor layers of the transistor this tendency toward greater contact resistance is however, limited to a degree believed acceptable in many field-effect transistor uses.

The desired reward for acceptance of any compromise of this nature is of course realized in the simplification of device processing, probably increased wafer yields and the resulting decrease in device cost. The employment of a single metallization step is of course a notable area of present processing simplification. A significant enabling factor in achieving this single metallization involves use of the relatively inert secondary mask element and the separation of gate region fabrications steps from source and drain region fabrication steps it makes possible.

Another area of present processing simplification which may be viewed as the acceptance of device-impacting compromise resides in the area of combined electron beam and optical lithography steps in a single device. While conventional wisdom may suggest the maintenance of separation between processes involving these two exposure arrangements is desirable to avoid their compromising interaction, the present inventors believe the combination of these exposures as disclosed herein and in the literature is sufficiently well tuned so as to have little negative effect on the resulting devices.

Another present process enhancement concerns a selective gate recess etch, which allows for unusually desirable control of the gate etch. Typically, gate recess etching is performed in an iterative, "etch to a target current" process. The SLIMFET process however, discloses a gate etch that can be accomplished without probing the ohmic contacts and thereby allows the ohmic contacts to be covered with protective $Si_3N4$ during the gate recess etch. Additionally, the SLIMFET process prevents problems with metal step coverage or metal to metal overlap, problems whose elimination relate closely to yield improvement.

Another feature of the disclosed fabrication is the use of a non-alloy ohmic metal process which further improves device uniformity and eliminates an undesirable high temperature processing sequence. The SLIMFET process also requires only one dielectric deposition step instead of two as in the best existing technique. Metal definition in the disclosed SLIMFET process is by lift-off and not by the more expensive ion milling. This metal lift-off requires no expensive equipment, and does not introduce damage or transistor performance degradation. Finally the employed process for this device is also compatible with monolithic microwave integrated circuit (MMIC) and other fabrication techniques and minimizes process variations, cycle time, and cost.

The present invention is therefore believed to represent the first ever AlGaAs/InGaAs HEMT/PHEMT fabricated using a single layer metallization scheme for both the Schottky gate and ohmic contacts. The fabricated device achieves a cut-off frequency of 59 GHz for sub 0.5 micron gate length, which represents state-of-the-art performance in single metal transistor. The SLIMFET process is again achieved through the integration of: the electron-beam/ optical lithography process, selective gate recess etching, and non-alloyed ohmic contacts. The SLIMFET process greatly simplifies the fabrication of FET devices while minimizing process variations. The described process is also believed feasible for lower frequency amplifier transistors.

While the apparatus and method herein described constitute a preferred embodiment of the invention, it is to be understood that the invention is not limited to this precise form of apparatus or method and that changes may be made therein without departing from the scope of the invention which is defined in the appended claims.

What is claimed is:

1. A method of forming gate, source and drain electrical contacts in a group III–V semiconductor material secondary mask-inclusive field-effect transistor comprising the steps of:

providing a transistor-divided group III–V semiconductor material field-effect transistor wafer in which a first thin semiconductor etch stop layer overlays a selected one of a channel layer and a channel layer-covering barrier layer and in which a superimposed group III–V semiconductor material-inclusive ohmic connection layer is overlaid by a second semiconductor etch stop layer and then a group III–V semiconductor material secondary mask layer;

forming a gate window recess extending through said secondary mask layer and said second semiconductor etch stop layer down to said ohmic connection layer using a temporary first photoresist mask etching sequence;

covering said secondary mask layer and said now-exposed gate window recess ohmic connection layer with a second and then third temporary photoresist mask layers, forming source, drain and gate region openings through said second and third temporary photoresist mask layers using a photolithographic sequence, said formed openings extending down to said group III–V semiconductor material secondary mask layer in said source and drain openings and through said secondary mask and second metallic semiconductor etch stop layers down to said ohmic connection layer in said gate window opening;

etching away both said ohmic connection layer in said gate window opening and said permanent secondary mask layer in said source and drain openings;

halting said etching in said gate window opening and in said source and drain openings at said first thin semiconductor etch stop layer and at said second thin semiconductor etch stop layer respectively;

removing said first thin semiconductor etch stop layer from said gate window opening and said second thin semiconductor etch stop layer from said source and drain openings, said removing step exposing said selected one of a channel layer and a channel layer-covering barrier layer in said gate window opening and said ohmic connection layer in said source and drain openings;

forming a Schottky barrier electrical contact with said selected one of a channel layer and a channel layer-covering barrier layer semiconductor materials in said gate window location and a non-alloyed ohmic electrical contact with said ohmic connection semiconductor material layer in said source and drain locations by depositing a single layer of contact metal over exposed surfaces of said wafer;

removing portions of said second and third temporary photoresist mask layers and said single layer of contact metal external of said gate window Schottky barrier electrical contact and said source and drain non-alloyed ohmic electrical contact.

2. The method of forming gate, source and drain electrical contacts of claim 1 wherein said group III–V semiconductor material is gallium arsenide and said field-effect transistor is one of a metal semiconductor field-effect transistor, a MESFET, a high electron mobility transistor and pseudomorphic high electron mobility transistor.

3. The method of forming gate, source and drain electrical contacts of claim 2 wherein said field-effect transistor includes smallest gate contact dimensions greater than six-tenths of a micron and wherein said step of defining source, drain and gate region openings is limited to an optical energy exposure sequence.

4. The method of forming gate, source and drain electrical contacts of claim 3 wherein said second and third temporary photoresist mask layers have differing optical spectrum exposure responses including an ultraviolet spectrum response for one of said photoresist mask layers.

5. The method of forming gate, source and drain electrical contacts of claim 3 wherein:

said step of removing said first thin semiconductor etch stop layer and said second thin semiconductor etch stop layer includes a simultaneous etching in said gate window opening and in said source and drain openings using a citric acid etchant solution; and said simultaneous etchings terminating at said first thin semiconductor etch stop layer and at said second thin semiconductor etch stop layer respectively.

6. The method of forming gate, source and drain electrical contacts of claim 1 wherein said field-effect transistor is a MESFET and said selected one of a channel layer and a channel layer-covering barrier layer, overlaid by said first thin semiconductor etch stop layer, comprises a channel layer.

7. The method of forming gate, source and drain electrical contacts of claim 1 wherein said field-effect transistor includes smallest gate contact dimensions of less than six-tenths of a micron, and wherein said step of defining source, drain and gate region openings includes an electron beam exposure sequence.

8. The method of forming gate, source and drain electrical contacts of claim 7 wherein said group III–V semiconductor material is gallium arsenide, said group III–V semiconductor material secondary mask layer is also comprised of gallium arsenide and wherein said steps commencing with covering said secondary mask layer and said now-exposed gate window recess ohmic connection layer with a second and then third temporary photoresist mask layers comprise:

covering said secondary mask layer and said now exposed gate region ohmic connection layer of each transistor with a second and an outermost third temporary photoresist mask layers, said second and third temporary photoresist mask layers having electron beam and optical masking properties respectively;

opening source and drain recess apertures through said second and third temporary photoresist mask layers of each said transistor using an optical exposure and etching sequence, said source and drain recess apertures extending down to said gallium arsenide secondary mask material layer;

dissolving said outermost third photoresist layer from coverage of said second photoresist layer;

defining a gate aperture position and gate aperture size in said second photoresist layer in said gate window location using an electron beam lithography exposure and development sequence;

etching a gate contact recess aperture through said ohmic connection material layer at said gate aperture position in said gate window location using a selective etch sequence, said gate contact recess aperture extending down to said first etch stop material-covered layer;

said selective etching sequence being halted in said gate contact recess aperture of said gate window location by said first etch stop layer material;

etching away said gallium arsenide secondary mask layer in said source and drain locations down to said second etch stop layer material using a selective etch sequence;

depositing contact metal over exposed semiconductor layers in said gate contact recess aperture and said source and drain locations;

said contact metal forming a Schottky barrier electrical contact relationship with said selected one of a channel layer and a channel layer-covering barrier layer semiconductor material in said gate contact recess aperture and a non-alloyed linear ohmic contact electrical relationship with said ohmic connection semiconductor material layer in said source and drain locations;

removing said second temporary photoresist layer from said wafer, said removing simultaneously performing a metal lift-off clearing of Schottky barrier contact metal around said gate window and said source and drain locations of said transistor.

9. The method of forming gate, source and drain electrical contacts of claim 8 wherein said steps of etching a gate contact recess aperture through said ohmic connection material layer and said step of etching away said gallium arsenide mask layer in said source and drain locations are performed by a single selective etching step.

10. The method of forming gate, source and drain electrical contacts of claim 8 wherein said selective etching step includes a citric acid and hydrogen peroxide etchant solution.

11. The method of forming gate, source and drain electrical contacts of claim 8 wherein said selected one of a channel layer and a channel layer-covering barrier layer is a channel layer and said field-effect transistor is a metal semiconductor metal transistor, a MESFET.

12. The method of forming gate, source and drain electrical contacts of claim 8 wherein said selected one of a channel layer and a channel layer-covering barrier layer is a channel layer covering barrier layer and said field-effect transistor is a pseudomorphic high electron mobility transistor.

13. The method of forming gate, source and drain electrical contacts of claim 8 wherein said selected one of a channel layer and a channel layer-covering barrier layer is a channel layer-covering barrier layer and said field-effect transistor is a high electron mobility transistor.

14. The method of forming gate, source and drain electrical contacts of claim 1 wherein said step of forming a gate window recess extending through said secondary mask layer and said second semiconductor etch stop layer down to said ohmic connection layer using a temporary first photoresist mask etching sequence includes an optical exposure sequence and a citric acid etch sequence through said secondary mask layer.

15. The method of forming gate, source and drain electrical contacts of claim 1 wherein said step of covering said secondary mask layer and said now-exposed gate window recess ohmic connection layer with a second and then a third temporary photoresist mask layers includes a PGMI photoresist second layer.

16. The method of forming gate, source and drain electrical contacts of claim 1 wherein said step of forming source, drain and gate region openings through said second and third temporary photoresist mask layers also includes providing a metal lift-off procedure-enabling overhang relationship of said third temporary photoresist mask layer with said second photoresist mask layer in said gate window and said source and drain openings.

17. The method of forming gate, source and drain electrical contacts of claim 1 wherein said step of removing said first thin semiconductor etch stop layer from said gate window opening and said second thin semiconductor etch stop layer from said source and drain openings includes simultaneous water diluted buffered oxide etching.

18. The method of forming gate, source and drain electrical contacts of claim 1 wherein said step of forming a Schottky barrier electrical contact with said selected one of a channel layer and a channel layer-covering barrier layer semiconductor materials in said gate window location and a non-alloyed ohmic electrical contact with said ohmic connection semiconductor material layer in said source and drain locations by depositing a single layer of contact metal includes depositing the metal combination of titanium platinum gold over exposed surfaces of gallium arsenide-inclusive group III–V semiconductor layer material.

19. The method of forming gate, source and drain electrical contacts of claim 1 wherein said step of removing portions of said second and third temporary photoresist mask layers and said single layer of contact metal external of said gate window Schottky barrier electrical contact and said source and drain non-alloyed ohmic electrical contact includes a metal lift-off removing enabled by said second temporary photoresist mask layer.

20. The method of forming gate, source and drain electrical contacts of claim 1 wherein said step of forming a Schottky barrier electrical contact with said selected one of a channel layer and a channel layer-covering barrier layer semiconductor materials in said gate window location and a non-alloyed ohmic electrical contact with said ohmic connection semiconductor material layer in said source and drain locations by depositing a single layer of contact metal includes depositing the metal combination of platinum gold over exposed surfaces of gallium arsenide-inclusive group III–V semiconductor layer material.

* * * * *